United States Patent
Higaki et al.

(10) Patent No.: US 10,823,808 B2
(45) Date of Patent: Nov. 3, 2020

(54) IMAGE PROCESSING APPARATUS, MAGNETIC RESONANCE IMAGING APPARATUS, AND IMAGE GENERATING METHOD

(71) Applicant: CANON MEDICAL SYSTEMS CORPORATION, Otawara-shi (JP)

(72) Inventors: Toru Higaki, Hiroshima (JP); Kazuo Awai, Hiroshima (JP)

(73) Assignee: CANON MEDICAL SYSTEMS CORPORATION, Otawara-shi (JP)

( * ) Notice: Subject to any disclaimer, the term of this patent is extended or adjusted under 35 U.S.C. 154(b) by 41 days.

(21) Appl. No.: 16/104,992

(22) Filed: Aug. 20, 2018

(65) Prior Publication Data

US 2019/0064300 A1    Feb. 28, 2019

(30) Foreign Application Priority Data

Aug. 24, 2017   (JP) .................................. 2017-161584

(51) Int. Cl.
| | |
|---|---|
| *G01R 33/563* | (2006.01) |
| *G01R 33/56* | (2006.01) |
| *G06T 11/00* | (2006.01) |
| *G01R 33/561* | (2006.01) |

(52) U.S. Cl.
CPC ... *G01R 33/56341* (2013.01); *G01R 33/5602* (2013.01); *G01R 33/5608* (2013.01); *G01R 33/5616* (2013.01); *G06T 11/003* (2013.01)

(58) Field of Classification Search
CPC .................. G01R 33/5602; G01R 33/5608
See application file for complete search history.

(56) References Cited

U.S. PATENT DOCUMENTS

| | | | |
|---|---|---|---|
| 8,805,473 B2 | 8/2014 | Sugiura et al. | |
| 2010/0081918 A1* | 4/2010 | Sugiura .................. | A61B 5/055 600/410 |
| 2014/0212017 A1* | 7/2014 | Sugiura .................. | A61B 5/055 382/131 |
| 2016/0202338 A1* | 7/2016 | Kimura ............ | G01R 33/56341 324/309 |

FOREIGN PATENT DOCUMENTS

| | | |
|---|---|---|
| JP | 2010-99455 | 5/2010 |
| JP | 2016-123865 | 7/2016 |

* cited by examiner

*Primary Examiner* — John J Lee
(74) *Attorney, Agent, or Firm* — Oblon, McClelland, Maier & Neustadt, L.L.P.

(57) ABSTRACT

An image processing apparatus according to an embodiment includes processing circuitry. The processing circuitry obtains a first Magnetic Resonance (MR) image corresponding to a first b-factor and corresponding to each of a plurality of axial directions and to obtain a second MR image corresponding to a second b-factor different from the first b-factor and corresponding to each of the plurality of axial directions. The processing circuitry obtains through a calculation, with respect to each of the axial directions, an MR image as a computed image corresponding to a third b-factor different from the first b-factor and the second b-factor by using the first MR image and the second MR image. The processing circuitry generates a combined image by combining together the plurality of computed images each of which was obtained with respect to a different one of the axial directions.

9 Claims, 7 Drawing Sheets

IMAGE PROCESSING APPARATUS, MAGNETIC RESONANCE IMAGING APPARATUS, AND IMAGE GENERATING METHOD

CROSS-REFERENCE TO RELATED APPLICATIONS

This application is based upon and claims the benefit of priority from Japanese Patent Application No. 2017-161584, filed on Aug. 24, 2017; the entire contents of which are incorporated herein by reference.

FIELD

Embodiments described herein relate generally to an image processing apparatus, a magnetic resonance imaging apparatus, and an image generating method.

BACKGROUND

Examples of Magnetic Resonance Imaging (MRI) methods include a method called Diffusion Weighted Imaging (DWI). According to a DWI method, diffusion movements of hydrogen atoms are expressed in images as a result of applying a pair of gradient magnetic fields called Motion Probing Gradient (MPG) pulses.

A value called "b-factor" expresses the magnitude of each of the MPG pulses. The larger the b-factor is, the better diffusion movements are reflected in an obtained image. However, when the application time period of an MPG pulse is increased for the purpose of increasing the b-factor, the signal-to-noise ratio (SNR) may be lowered, or motion artifacts may increase.

To cope with this situation, a technique called computed DWI (cDWI) is known by which a DWI-derived image having a larger b-factor is obtained as a computed diffusion weighted image, through a calculating process using a DWI-derived image acquired with a relatively small b-factor.

DETAILED DESCRIPTION

An image processing apparatus according to an embodiment includes processing circuitry. The processing circuitry obtains a first Magnetic Resonance (MR) image corresponding to a first b-factor and corresponding to each of a plurality of axial directions and to obtain a second MR image corresponding to a second b-factor different from the first b-factor and corresponding to each of the plurality of axial directions. The processing circuitry obtains through a calculation, with respect to each of the axial directions, an MR image as a computed image corresponding to a third b-factor different from the first b-factor and the second b-factor by using the first MR image and the second MR image. The processing circuitry generates a combined image by combining together the plurality of computed images each of which was obtained with respect to a different one of the axial directions.

In the following sections, exemplary embodiments and modification examples of an image processing apparatus and a magnetic resonance imaging apparatus will be explained in detail, with reference to the accompanying drawings.

First Embodiment

Figure 1:
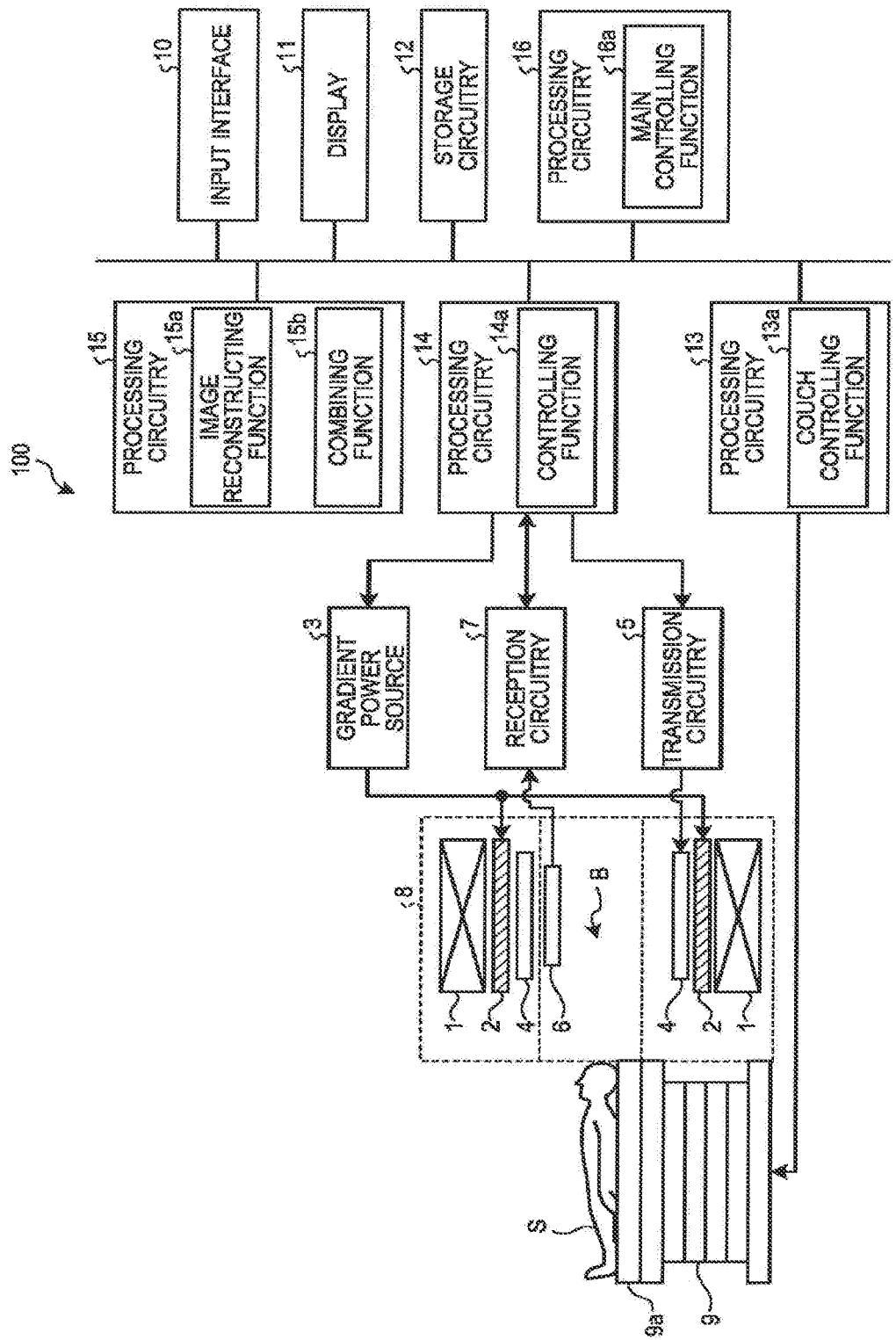
FIG. 1 is a diagram illustrating an exemplary configuration of a magnetic resonance imaging (MRI) apparatus according to a first embodiment.

FIG. 1 is a diagram illustrating an exemplary configuration of a Magnetic Resonance Imaging (MRI) apparatus 100 according to a first embodiment. For example, as illustrated in FIG. 1, the MRI apparatus 100 according to the first embodiment includes a static magnetic field magnet 1, a gradient coil 2, a gradient power source 3, a transmission coil 4, transmission circuitry 5, a reception coil 6, reception circuitry 7, a gantry 8, a couch 9, an input interface 10, a display 11, storage circuitry 12, and processing circuitries 13 to 16.

The static magnetic field magnet 1 is configured to form a static magnetic field. For example, the static magnetic field magnet 1 is configured to generate the static magnetic field in an image taking space in which an examined subject (hereinafter "patient") S is placed. More specifically, the static magnetic field magnet 1 is formed to have a hollow and substantially circular cylindrical shape (which may have an oval cross-section orthogonal to the central axis thereof) and is configured to generate the static magnetic field in the space on the inside of the circular cylinder. For example, the static magnetic field magnet 1 includes a cooling container formed to have a substantially circular cylindrical shape and a magnet such as a superconductive magnet that is immersed in a cooling member (e.g., liquid helium) filling the cooling container. In this situation, for example, the static magnetic field magnet 1 may be configured to generate the static magnetic field by using a permanent magnet.

The gradient coil 2 is configured to superimpose, in an arbitrary axial direction, a gradient magnetic field onto the static magnetic field. For example, the gradient coil 2 is disposed on the inside of the static magnetic field magnet 1 and is configured to apply the gradient magnetic field to the image taking space in which the patient S is placed. More specifically, the gradient coil 2 is formed to have a hollow and substantially circular cylindrical shape (which may have an oval cross-section orthogonal to the central axis thereof) and is configured to generate gradient magnetic fields along X-, Y-, and Z-axes that are orthogonal to one another in the space on the inside of the circular cylinder. In this situation, the X-axis, the Y-axis, and the Z-axis structure an apparatus coordinate system unique to the MRI apparatus 100. For example, the Z-axis is set so as to coincide with the axis of the circular cylinder of the gradient coil 2 and to extend along a magnetic flux in the static magnetic field generated by the static magnetic field magnet 1. Further, the X-axis is set to extend along the horizontal direction orthogonal to the Z-axis. The Y-axis is set to extend along the vertical direction orthogonal to the Z-axis.

By supplying an electric current to the gradient coil 2 the gradient power source 3 is configured to cause the gradient magnetic field to be generated along each of the X-, Y-, and Z-axes, in the space formed inside the gradient coil 2.

By generating the gradient magnetic fields along the X-, Y-, and Z-axes in this manner, the gradient power source 3 is able to cause the gradient magnetic fields to be generated along a read-out direction, a phase-encoding direction, and a slice direction, respectively. The axes extending along the read-out direction, the phase-encoding direction, and the slice direction structure a logical coordinate system used for defining slice regions or a volume region serving as a target of an image taking process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

The gradient magnetic fields are superimposed on the static magnetic field generated by the static magnetic field magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-out direction. Further, the phase-encoding gradient magnetic field appends position information in the phase-encoding direction to an MR signal, by varying the phase of the MR signal along the phase-encoding direction. Further, when an image taking region is represented by slice regions, the slice gradient magnetic field is used for determining the orientations, the thicknesses, and the quantity of the slice regions. In contrast, when an image taking region is represented by a volume region, the slice gradient magnetic field appends position information along the slice direction to an MR signal, by varying the phase of the MR signal in accordance with the position in the slice direction.

The transmission coil 4 is arranged on the inside of the gradient coil 2 and is configured to apply a Radio Frequency (RF) magnetic field to the image taking space in which the patient S is placed. More specifically, the transmission coil 4 is formed to have a hollow and substantially circular cylindrical shape (which may have an oval cross-section orthogonal to the central axis thereof) and is configured, on the basis of an RF pulse signal output from the transmission circuitry 5, to apply the RF magnetic field to the space on the inside of the circular cylinder. The transmission coil 4 is a Radio Frequency (RF) coil configured to generate the MR signals by applying the RF magnetic field to the patient placed in the static magnetic field.

The transmission circuitry 5 is configured to output the RF pulse signal corresponding to a Larmor frequency to the transmission coil 4.

The reception coil 6 is an RF coil configured to receive the MR signals emitted from the patient S. For example, the reception coil 6 is attached to the patient S placed on the inside of the transmission coil 4 and is configured to receive the MR signals emitted from the patient S due to an influence of the RF magnetic fields applied by the transmission coil 4. Further, the reception coil 6 is configured to output the received MR signals to the reception circuitry 7. For example, as the reception coil 6, a coil dedicated for each of the various sites serving as targets of image taking processes is used. In this situation, examples of the coils dedicated for the various sites include a reception coil for the head, a reception coil for the neck, a reception coil for a shoulder, a reception coil for the chest, a reception coil for the abdomen, a reception coil for a leg, and a reception coil for the spine.

The reception circuitry 7 is configured to generate MR signal data on the basis of the MR signals output from the reception coil 6 and to output the generated MR signal data to the processing circuitry 14.

In the present example, the situation in which the transmission coil 4 applies the RF magnetic field so that the reception coil 6 receives the MR signals is explained; however, possible embodiments of the RF coils are not limited to this example. For instance, the transmission coil 4 may further have a receiving function to receive the MR signals. Also, the reception coil 6 may further have a transmitting function to apply the RF magnetic field. When the transmission coil 4 has the receiving function, the reception circuitry 7 generates MR signal data also from the MR signals received by the transmission coil 4. Further, when the reception coil 6 has the transmitting function, the transmission circuitry 5 outputs an RF pulse signal also the reception coil 6.

The gantry 8 houses therein the static magnetic field magnet 1, the gradient coil 2, and the transmission coil 4. More specifically, the gantry 8 has a bore B that is hollow and is formed to have a circular cylindrical shape. The static magnetic field magnet 1, the gradient coil 2, and the transmission coil 4 are housed in the gantry 8, while being disposed so as to surround the bore B. In this situation, the space formed on the inside of the bore B of the gantry 8 corresponds to the image taking space in which the patient S is placed when an image taking process is performed on the patient S.

In the first embodiment, an example is explained in which the MRI apparatus 100 is shaped to be of a so-called tunnel type including the static magnetic field magnet 1 and the gradient coil 2 each formed to have a substantially circular cylindrical shape; however, possible embodiments are not limited to this example. For instance, the MRI apparatus 100 may be shaped to be of a so-called open type in which a pair of static magnetic field magnets and a pair of gradient coils are arranged to oppose each other, while the image taking space in which the patient S is placed is interposed therebetween.

The couch 9 includes a couchtop 9a on which the patient S is placed. When an image taking process is performed on the patient S, the couchtop 9a is inserted to the inside of the bore B of the gantry 8. For example, the couch 9 is installed in such a manner that the longitudinal direction thereof extends parallel to the central axis of the static magnetic field magnet 1.

The input interface 10 is configured to receive operations to input various types of instructions and various types of information from the operator. More specifically, the input interface 10 is connected to the processing circuitry 16 and is configured to convert the input operations received from the operator into electrical signals and to output the electrical signals to the processing circuitry 16. For example, the input interface 10 is realized by using a trackball, a switch button, a mouse, a keyboard, a touchpad on which an input operation can be performed by touching the operation screen thereof, a touch screen in which a display screen and a touchpad are integrally formed, a contactless input interface using an optical sensor, an audio input interface, and/or the like that are used for setting an image taking condition and a Region of Interest (ROI). In the present disclosure, possible embodiments of the input interface 10 are not limited to those including physical operation component parts such as a mouse and/or a keyboard. Possible examples of the input interface 10 include an electrical signal processing circuitry configured to receive an electrical signal corresponding to an input operation from an external input device provided separately from the apparatus and to output the received electrical signal to the processing circuitry 16.

The display 11 is configured to display various types of information and various types of images. More specifically, the display 11 is connected to the processing circuitry 16 and is configured to convert the various types of information and data of the various types of images sent thereto from the processing circuitry 16, into display-purpose electrical signals and to output the display-purpose electrical signals. For example, the display 11 is realized by using a liquid crystal monitor, a Cathode Ray Tube (CRT) monitor, a touch panel, or the like.

The storage circuitry 12 is configured to store various types of data therein. More specifically, the storage circuitry 12 is configured to store therein the MR signal data and image data. For example, the storage circuitry 12 is realized by using a semiconductor memory element such as a Random Access Memory (RAM), a flash memory, or the like, or a hard disk, an optical disk, or the like.

The processing circuitry 13 includes a couch controlling function 13a. The couch controlling function 13a is connected to the couch 9 and is configured to control operations of the couch 9 by outputting a control-purpose electrical signal to the couch 9. For example, the couch controlling function 13a receives, via the input interface 10, an instruction to move the couchtop 9a in a longitudinal direction, an up-and-down direction, or a left-and-right direction from the operator and operates a driving mechanism for the couchtop 9a included in the couch 9 so as to move the couchtop 9a according to the received instruction.

The processing circuitry 14 includes a controlling function 14a. The controlling function 14a is configured to execute various types of pulse sequences by controlling the gradient power source 3, the transmission circuitry 5, and the reception circuitry 7, on the basis of sequence execution data output from the processing circuitry 16. For example, by transmitting an input signal to the gradient power source 3, to the transmission circuitry 5, and to the reception circuitry 7, the controlling function 14a drives and controls the gradient power source 3, the transmission circuitry 5, and the reception circuitry 7.

In this situation, the sequence execution data is information that defines each of the pulse sequences indicating a procedure performed to acquire the MR signal data. More specifically the sequence execution data is information that defines: the timing with which the electric current is to be supplied from the gradient power source 3 to the gradient coil 2 and the intensity of the electric current to be supplied; the intensity of the RF pulse signal to be supplied from the transmission circuitry 5 to the transmission coil 4 and the timing with which the RF pulse signal is to be supplied; the detection timing with which the MR signals are to be detected by the reception circuitry 7, and the like.

In this situation, the pulse sequences include a pulse sequence used for performing a diffusion weighted imaging process (hereinafter, "diffusion weighted imaging pulse sequence"). Examples of the diffusion weighted imaging pulse sequence include a sequence obtained by incorporating MPG pulses into a Spin-Echo (SE) type Echo Planar Imaging (EPI) sequence. In such a diffusion weighted imaging pulse sequence, after an excitation pulse having a 90-degree flip angle is applied, a re-focusing pulse having a 180-degree flip angle is applied. The excitation pulse and the re-focusing pulse are examples of RF magnetic fields and are applied by the transmission coil 4. The MPG pulses are gradient magnetic fields applied for the purpose of weighting the diffusion. In the time period from the excitation pulse to the re-focusing pulse and in the time period from the re-focusing pulse to a data acquisition, one MPG pulse each is applied by the gradient coil 2.

Further, as a result of executing the various types of pulse sequences, the controlling function 14a receives the MR signal data from the reception circuitry 7 and stores the received MR signal data into the storage circuitry 12. A set made up of pieces of MR signal data received by the controlling function 14a is stored in the storage circuitry 12 as data structuring a k-space as a result of being arranged two-dimensionally or three-dimensionally according to the position information appended by the read-out gradient magnetic field, the phase-encoding gradient magnetic field, and the slice gradient magnetic field described above.

In the first embodiment, while varying the b-factor, the controlling function 14a is configured to execute a diffusion weighted imaging pulse sequence with each of the plurality of b-factors. For example, the controlling function 14a controls the transmission coil 4 so as to apply the RF magnetic fields such as the excitation pulses and the re-focusing pulses. Further, the controlling function 14a is configured to control the gradient coil 2 so as to apply an MPG pulse having a designated b-factor to each of the plurality of axial directions, namely the X-axis direction, the Y-axis direction, and the 2-axis direction.

Generally speaking, MR images called diffusion weighted images tend to refer to MR images generated by reconstructing MR signals acquired while the b-factor has a relatively large value (e.g., b=approximately 1000 (s/mm$^2$)). However, the b-factors used in diffusion weighted imaging pulse sequences may include the b-factor of which the value is zero (0). In the present disclosure, MR images obtained as a result of executing a diffusion weighted imaging pulse sequence under the condition where the b-factor is zero will also be referred to as diffusion weighted images.

The processing circuitry 15 includes an image reconstructing function 15a and a combining function 15b. The image reconstructing function 15a is configured to generate an image on the basis of the MR signal data stored in the storage circuitry 12. More specifically, the image reconstructing function 15a generates the image by reading the MR signal data stored into the storage circuitry 12 by the controlling function 14a and further performing a reconstructing process such as a post-processing process (i.e., a Fourier transform or the like) on the read MR signal data. Further, the image reconstructing function 15a stores image data of the generated image into the storage circuitry 12.

In one example, the image reconstructing function 15a is configured to reconstruct and generate a diffusion weighted image by using the MR signals acquired by executing a diffusion weighted imaging pulse sequence. Further, the image reconstructing function 15a is configured to generate a plurality of diffusion weighted images corresponding to a plurality of b-factors, each corresponding to a different one of the plurality of axial directions.

The combining function 15b is configured to obtain through a calculating process, with respect to each of the axial directions, a diffusion weighted image as a computed diffusion weighted image corresponding to a b-factor different from any of the abovementioned plurality of b-factors, by using the plurality of diffusion weighted images generated by the image reconstructing function 15a. After that, the combining function 15b is configured to combine together the plurality of computed diffusion weighted images each of which was obtained with respect to a different one of the axial directions.

The processing circuitry 16 includes a main controlling function 16a. The main controlling function 16a is configured to exercise overall control of the MRI apparatus 100 by controlling constituent elements of the MRI apparatus 100. For example, the main controlling function 16a receives, from the operator, an input of an image taking condition via the input interface 10. Further, the main controlling function 16a generates sequence execution data on the basis of each of the received image taking conditions and executes various types of pulse sequences by transmitting the generated sequence execution data to the processing circuitry 14. Further, for example, the main controlling function 16a reads any of the image data from the storage circuitry 12 in response to a request from the operator and outputs the read image data to the display 11.

In this situation, for example, the processing circuitries 13 to 16 described above are each realized by using a processor. In that situation, for example, the processing functions of the processing circuitries 13 to 16 are stored in the storage circuitry 12 in the form of computer-executable programs. The processing circuitries are configured to realize the functions corresponding to the programs, by reading and executing the programs from the storage circuitry 12. In other words, each of the processing circuitries that have read the corresponding program has the one or more functions illustrated within the processing circuitry in FIG. 1.

Further, the functions of the four processing circuitries (i.e., the processing circuitries 13 to 16) may be included in single processing circuitry. For example, single processing circuitry may include the couch controlling function 13a, the controlling function 14a, the image reconstructing function 15a, the combining function 15b, and the main controlling function 16a. The single processing circuitry may be realized by using a processor, for example.

The term "processor" used in the above explanations denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). In this situation, instead of saving the programs in the storage circuitry 12, it is also acceptable to directly incorporate the programs in the circuitries of the processors. In that situation, the processors realize the functions thereof by reading and executing the programs incorporated in the circuitries thereof. Further, the processors in the present embodiment do not each necessarily have to be structured as single circuitry. It is also acceptable to structure one processor by combining together a plurality independent circuitries so as to realize the functions thereof.

The MRI apparatus 100 according to the first embodiment structured as described above is configured to perform a diffusion weighted image calculating process explained below for the purpose of improving the quality of the computed diffusion weighted images obtained through calculating process.

Figure 2:
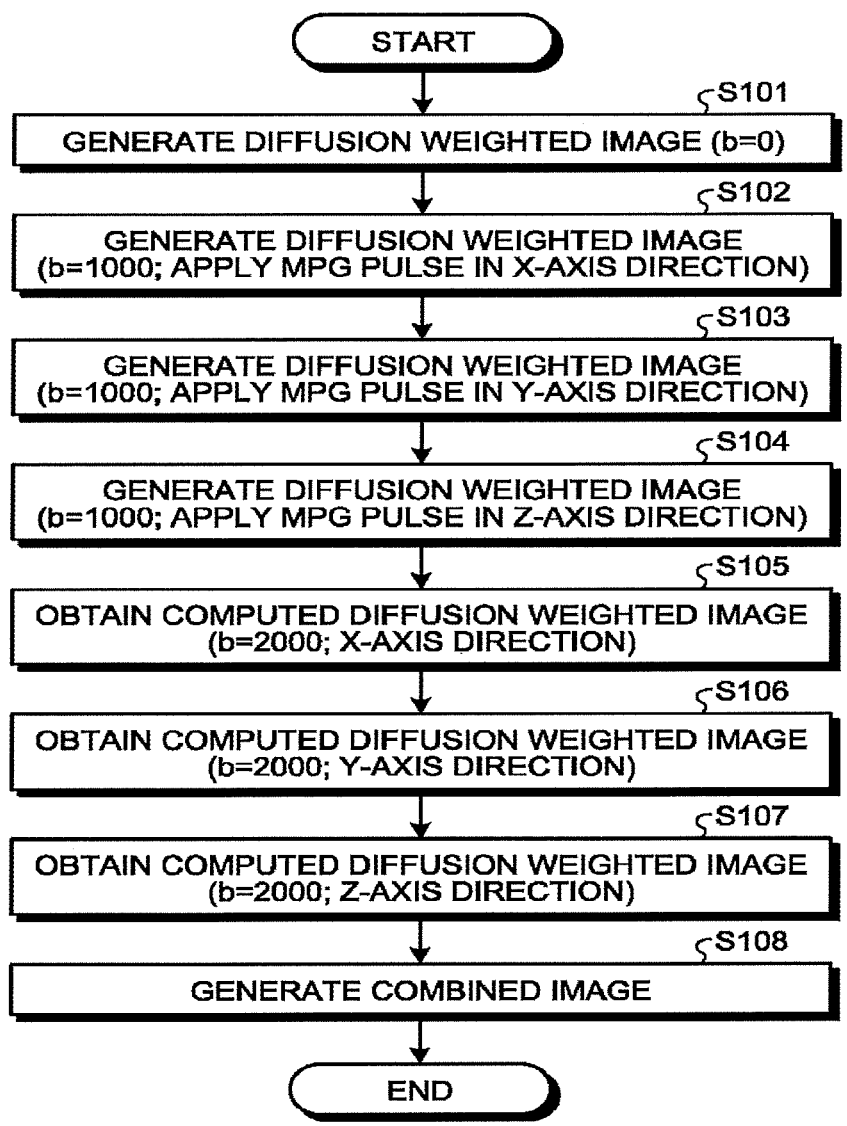
FIG. 2 is a flowchart illustrating a flow in an example of a diffusion weighted image calculating process performed by the MRI apparatus according to the first embodiment.
Figure 3:
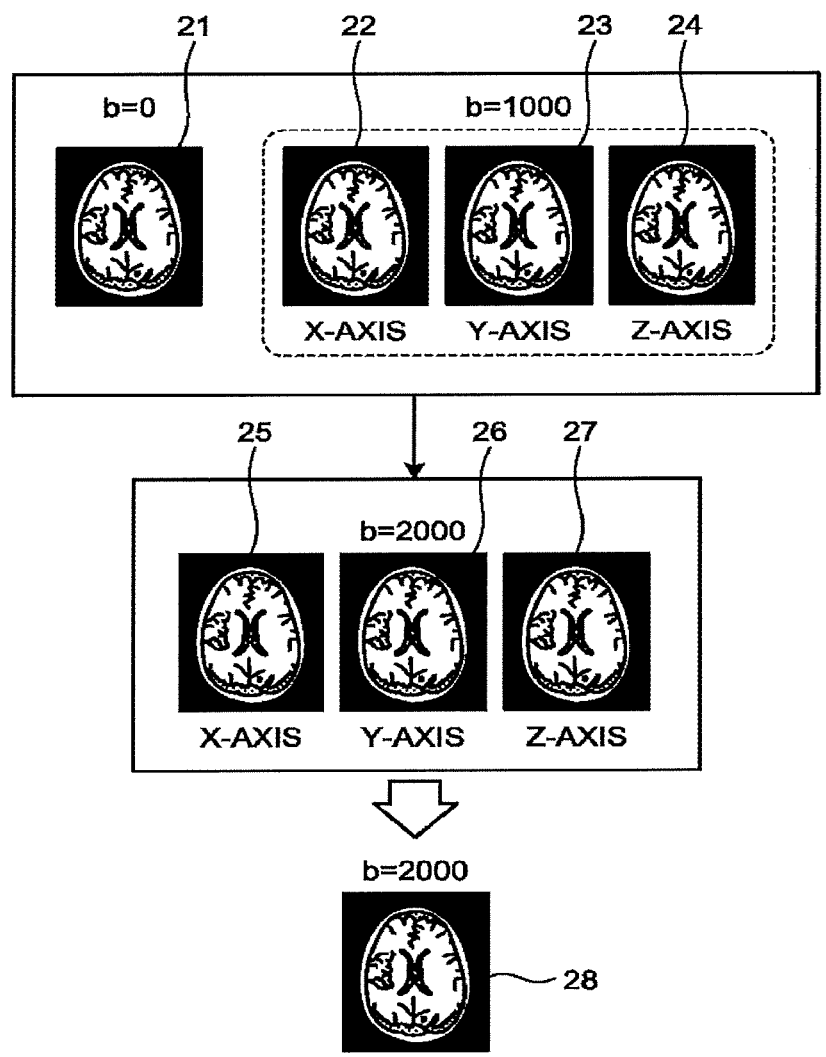
FIG. 3 is a drawing for explaining an example of the diffusion weighted image calculating process according to the first embodiment.

FIG. 2 is a flowchart illustrating a flow in an example of an image generating process performed by the MRI apparatus 100 according to the first embodiment. FIG. 3 is a drawing for explaining an example of the image generating process according to the first embodiment.

As illustrated in FIGS. 2 and 3, the image reconstructing function 15a generates a diffusion weighted image 21 corresponding to the condition where the b-factor is zero (step S101). For example, at step S101, the controlling function 14a acquires MR signals corresponding to the condition where the b-factor is zero, by executing a diffusion weighted imaging pulse sequence under the condition where the b-factor is zero. After that, on the basis of the acquired MR signals, the image reconstructing function 15a generates the diffusion weighted image 21 corresponding to the condition where the b-factor is zero. More specifically, on the basis of MR signal data based on the acquired MR signals, the image reconstructing function 15a generates the diffusion weighted image 21. In this manner, the image reconstructing function 15a generates the diffusion weighted image 21 corresponding to the b-factor of which the value is zero. In this situation, the diffusion weighted image 21 is an MR image obtained without applying any MPG pulse.

The single diffusion weighted image 21 is a diffusion weighted image corresponding to all the axial directions, namely, the X-axis direction, the Y-axis direction, and the Z-axis direction.

Further, the b-factor of which the value is zero is an example of the first b-factor. Further, the diffusion weighted image 21 is an example of the first MR image.

Further, the image reconstructing function 15a generates a diffusion weighted image 22 on the basis of MR signals acquired by applying an MPG pulse in the X-axis direction under the condition where the b-factor is 1000 (step S102). For example, at step S102, under the condition where the b-factor is 1000, the controlling function 14a executes a diffusion weighted imaging pulse sequence by which the MPG pulse is applied in the X-axis direction. As a result, the controlling function 14a acquires the MR signals corresponding to the situation where the MPG pulse is applied in the X-axis direction under the condition where the b-factor is 1000. After that, the image reconstructing function 15a generates the diffusion weighted image 22 on the basis of MR signal data based on the acquired MR signals. In this manner, the image reconstructing function 15a generates the diffusion weighted image 22 corresponding to the b-factor of which the value is 1000.

The b-factor of which the value is 1000 is different from the b-factor of which the value is zero and is an example of the second b-factor. Further, the diffusion weighted image 22 is an example of the second MR image corresponding to the X-axis direction.

Similarly, the image reconstructing function 15a generates a diffusion weighted image 23 on the basis of MR signals acquired by applying an MPG pulse in the Y-axis direction under the condition where the b-factor is 1000 (step S103). In this manner, the image reconstructing function 15a generates the diffusion weighted image 23 corresponding to the b-factor of which the value is 1000. The diffusion weighted image 23 is an example of the second MR image corresponding to the Y-axis.

Similarly, the image reconstructing function 15a generates a diffusion weighted image 24 on the basis of MR signals acquired by applying an MPG pulse in the Z-axis direction under the condition where the b-factor is 1000 (step S104). In this manner, the image reconstructing function 15a generates the diffusion weighted image 24 corresponding to the b-factor of which the value is 1000. The diffusion weighted image 24 is an example of the second MR image corresponding to the axis.

The diffusion weighted images 21 to 24 are images rendering cross-sections in mutually the same position of mutually the same patient S.

In this situation, as explained above, at step S101, the image reconstructing function 15a generates the diffusion weighted image 21 corresponding to each of the plurality of axial directions, on the basis of the MR signals obtained as a result of the controlling function 14a controlling the transmission coil 4 and the gradient coil 2. Similarly, at steps S102 through S104, the image reconstructing function 15a generates the diffusion weighted images 22 to 24 each of which corresponds to a different one of the plurality of axial directions, on the basis of the MR signals obtained as a result of the controlling function 14a controlling the transmission coil 4 and the gradient coil 2.

After that, the combining function 15b obtains a computed diffusion weighted image corresponding to the b-factor of which the value is 2000, by performing a calculating process that uses the diffusion weighted image and the diffusion weighted image 22 (step S105).

A specific example of the process at step S105 will be explained. For instance, by using Expression (1) presented below, the combining function 15b derives an Apparent Diffusion Coefficient (ADC) with respect to each of the pixels.

$$ADC = \log_n[S(1000) - S(0)]/(1000-0) \quad (1)$$

In Expression (1), S(1000) denotes the signal value of each of the pixels in the diffusion weighted image 22.

Further, S(0) denotes the signal value of each of the pixels in the diffusion weighted image 21.

After that, the combining function 15b derives a signal value S(2000) of each of the pixels in a computed diffusion weighted image 25, by using Expression (2) presented below.

$$S(2000) = S(0) \cdot \exp[-(2000-0) \cdot ADC] \quad (2)$$

Further, the combining function 15b obtains a diffusion weighted image in which the derived signal value S(2000) is arranged in each of all the pixels, as the computed diffusion weighted image 25.

Similarly, the combining function 15b obtains a computed diffusion weighted image 26 corresponding to the b-factor of which the value is 2000, by performing a calculating process that uses the diffusion weighted image 21 and the diffusion weighted image 23 (step S106).

Further, similarly, the combining function 15b obtains a computed diffusion weighted image 27 corresponding to the b-factor of which the value is 2000, by performing a calculating process that uses the diffusion weighted image 21 and the diffusion weighted image 24 (step S107).

Further, the combining function 15b generates a combined image 28 by combining together the computed diffusion weighted image 25, the computed diffusion weighted image 26, and the computed diffusion weighted image 27 (step S108). As a method for combining together the plurality of computed diffusion weighted images, it is acceptable to use any of various methods. For example, the combining function 15b may calculate the combined image 28 by adding together the computed diffusion weighted image 25, the computed diffusion weighted image 26, and the computed diffusion weighted image 27 and further dividing the image obtained by adding together the three computed diffusion weighted images by "3". The combined image 28 is an isotropic diffusion weighted image. After that, the combining function 15b ends the image generating process.

As explained above, the combining function 15b performs the calculating process explained below at steps S105 through S107. For example, with respect to each of the axial directions, the combining function 15b obtains through the calculation, a corresponding one of the computed diffusion weighted images 25 to 27 as a computed image, by using a corresponding one of the diffusion weighted images 22 to 24 and the diffusion weighted image 21. After that, at step S108, the combining function 15b generates the combined image 28 by combining together the plurality of computed diffusion weighted images 25 to 27 each of which was obtained with respect to a different one of the axial directions.

Figure 4:
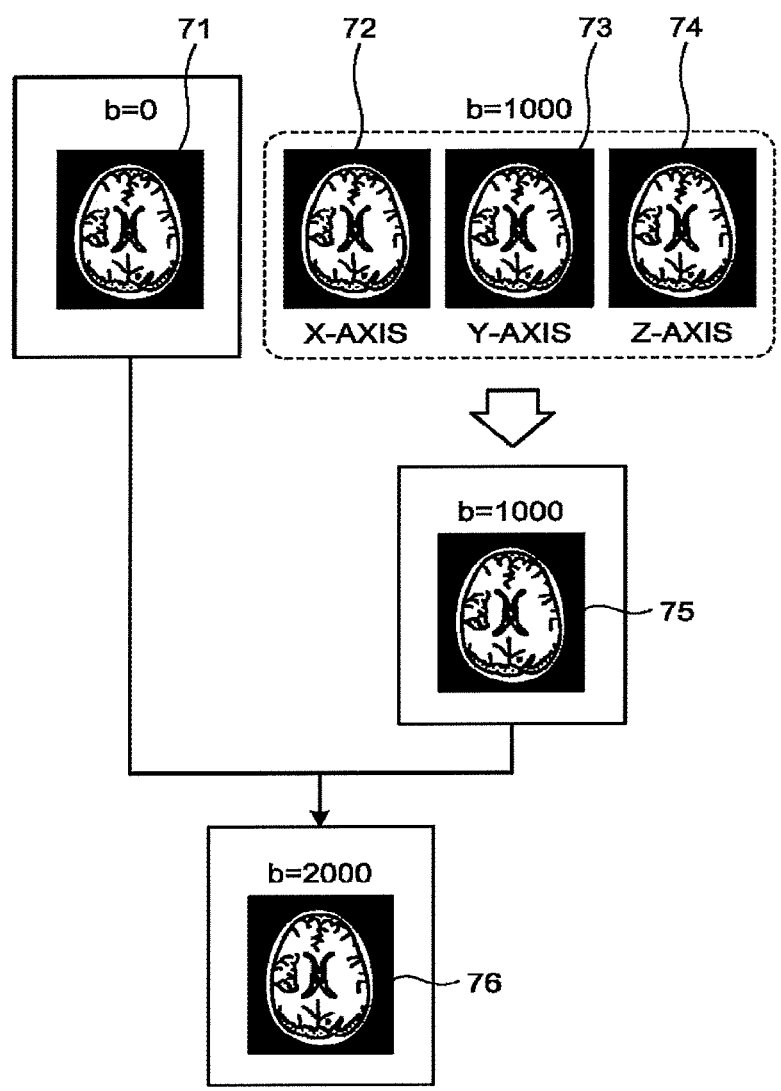
FIG. 4 is a drawing for explaining an example in which an MRI apparatus according to a comparison example obtains computed diffusion weighted images.

Next, an example will be explained in which an MRI apparatus according to a comparison example obtains computed diffusion weighted images. FIG. 4 is a drawing for explaining the example in which the MRI apparatus according to the comparison example obtains the computed diffusion weighted images.

As illustrated in FIG. 4, the MRI apparatus according to the comparison example generates a diffusion weighted image 71 corresponding to the condition where the b-factor is zero. Further, on the basis of MR signals acquired by applying an MPG pulse in the K-axis direction under the condition where the b-factor is 1000, the MRI apparatus according to the comparison example generates a diffusion weighted image 72.

Further, on the basis of MR signals acquired by applying an MFG pulse in the Y-axis direction under the condition where the b-factor is 1000, the MRI apparatus according to the comparison example generates a diffusion weighted image 73. Further, on the basis of MR signals acquired by applying an MPG pulse in the Z-axis direction under the condition where the b-factor is 1000, the MRI apparatus according to the comparison example generates a diffusion weighted image 74.

After that, the MRI apparatus according to the comparison example generates a combined image 75 by combining together the diffusion weighted image 72, the diffusion weighted image 73, and the diffusion weighted image 74. At this time, when combining together the three diffusion weighted images 72 to 74, the MRI apparatus according to the comparison example may not be able to put together the corresponding pixels from the diffusion weighted images with a high level of precision, in some situations.

The MRI apparatus according to the comparison example obtains a computed diffusion weighted image 76 corresponding to the b-factor of which the value is 2000, by performing a calculating process that uses the diffusion weighted image 71 and the combined image 75. More specifically, the MRI apparatus according to the comparison example obtains the computed diffusion weighted image 76 by deriving an ADC of each of the pixels.

In this situation, as mentioned above, because the corresponding pixels from the diffusion weighted images 72 to 74 may not be put together with a high level of precision in some situations, when the combined image 75 is obtained through the combining process, the levels of precision of the ADCs estimated for obtaining the computed diffusion weighted image 76 may not be excellent. When the levels of precision of the ADCs are not excellent, the quality of the computed diffusion weighted image 76 obtained through the calculating process may not be excellent in some situations.

In contrast, the MRI apparatus 100 according to the first embodiment is configured to derive the ADCs between the diffusion weighted images 22 to 24 obtained before the combining process and the diffusion weighted image 21. For this reason, the MRI apparatus 100 is able to derive the ADCs with higher levels of precision than the MRI apparatus according to the comparison example is. Accordingly, by using the MRI apparatus 100, it is possible to improve the quality of the combined image (the computed diffusion weighted images) obtained through the calculating process.

Further, the MRI apparatus 100 according to the first embodiment generates, at step S101, the diffusion weighted image 21 corresponding to the condition where the b-factor is zero. Accordingly, because there is no need to apply MPG pulses, there is no need to separately generate a diffusion weighted image with respect to each of the three axes, namely the X-axis, the Y-axis, and the axis. Consequently, by using the MRI apparatus 101 according to the first embodiment, it is possible to easily obtain the combined image 28.

A Modification Example of First Embodiment

In the first embodiment above, the example is explained in which the two types of b-factors that are set as the condition with the diffusion weighted images used for generating the computed diffusion weighted image 26 are zero and 1000; however, the two types of b-factors may have values other than zero and 1000.

In the following sections, a modification example in which the two types of b-factors are both larger than zero will be explained as a modification example of the first embodiment. A configuration of the MRI apparatus according to the modification example is the same as that of the MRI apparatus 100 according to the first embodiment illustrated in FIG. 1. The constituent elements that are the same as those in the first embodiment will be referred to by using the same reference characters, and the explanations thereof may be omitted.

Figure 5:
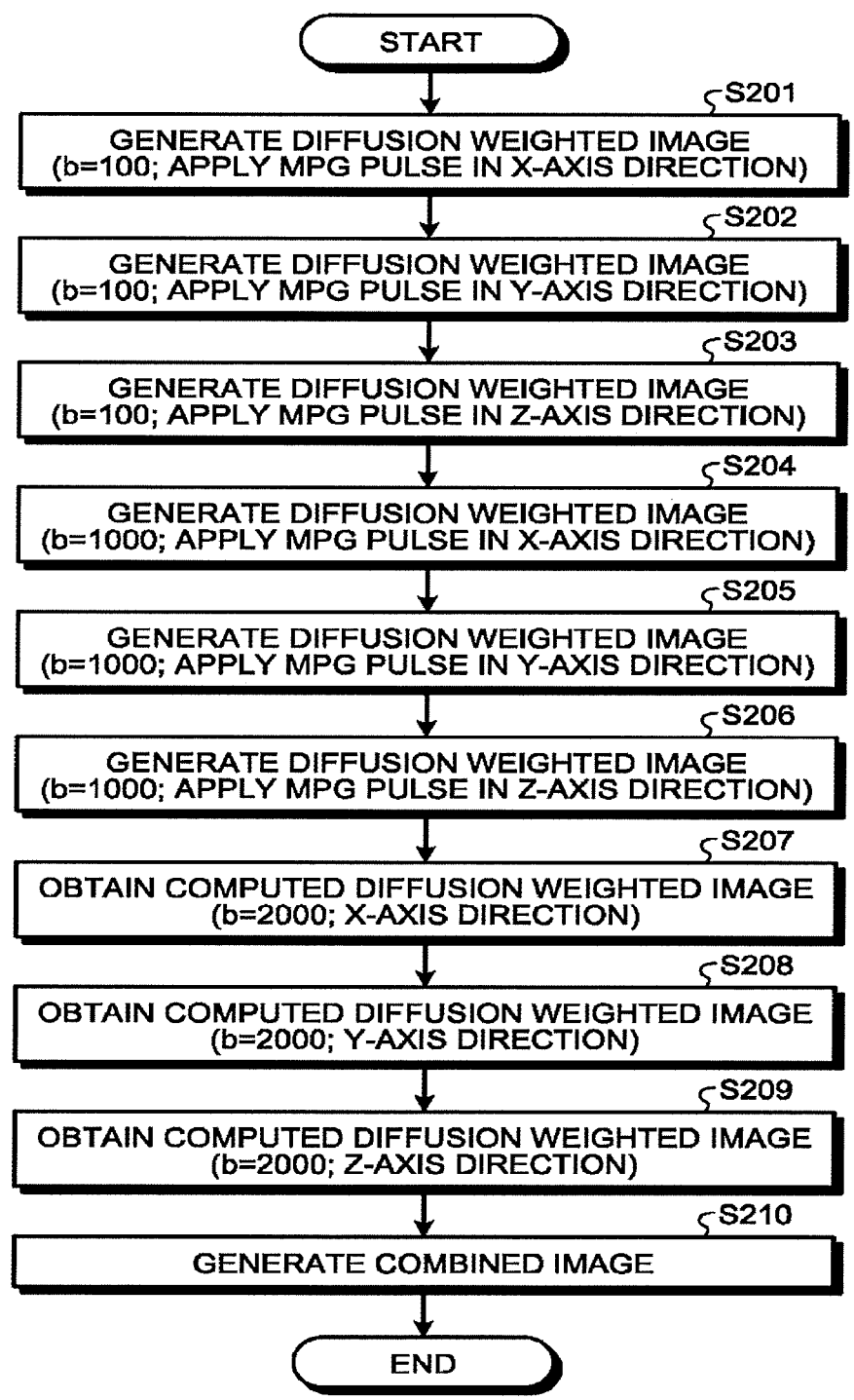
FIG. 5 is a flowchart illustrating a flow in an example of an image generating process performed by an MRI apparatus according to a modification example.
Figure 6:
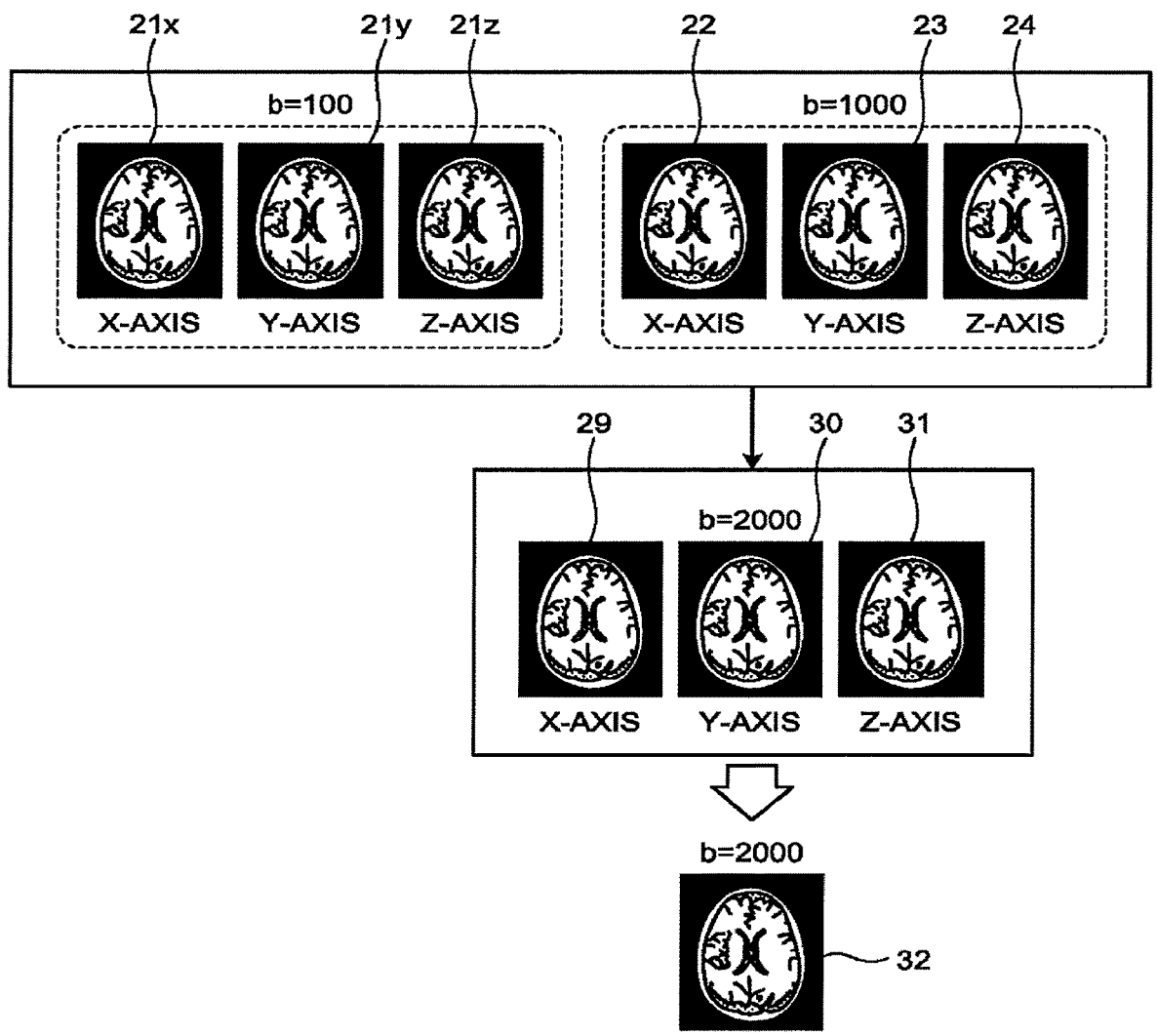
FIG. 6 is a drawing for explaining an example of the image generating process according to the modification example.

FIG. 5 is a flowchart illustrating a flow in an example of an image generating process performed by the MRI apparatus according to the modification example. FIG. 6 is a drawing for explaining an example of the image generating process according to the modification example.

As illustrated in FIG. 5, according to the modification example, steps S201 through S210 are performed. As illustrated in FIGS. 5 and 6, on the basis of MR signals acquired by applying an MPG pulse in the X-axis direction under the condition where the b-factor is 100, the image reconstructing function 15a generates a diffusion weighted image 21x (step S201).

For example, at step S201, the controlling function 14a executes a diffusion weighted imaging pulse sequence by which an MPG pulse is applied in the X-axis direction under the condition where the b-factor is 100. As a result, the controlling function 14a acquires MR signals corresponding to the situation where the MPG pulse is applied in the X-axis direction under the condition where the b-factor is 100. After that, on the basis of the MR signal data based on the acquired MR signals, the image reconstructing function 15a generates the diffusion weighted image 21x. In this manner, the image reconstructing function 15a generates the diffusion weighted image 21x corresponding to the b-factor of which the value is 100.

In this situation, the b-factor of which the value is 100 is an example of the first b-factor. Further, the diffusion weighted image 21x is an example of the first MR image corresponding to the X-axis direction.

Similarly, on the basis of MR signals acquired by applying an MPG pulse in the Y-axis direction under the condition where the b-factor is 100, the image reconstructing function 15a generates a diffusion weighted image 21y (step S202). In this manner, the image reconstructing function 15a generates the diffusion weighted image 21y corresponding to the b-factor of which the value is 100. The diffusion weighted image 21y is an example of the first MR image corresponding to the Y-axis.

Similarly, on the basis of MR signals acquired by applying an MPG pulse in the Z-axis direction under the condition where the b-factor is 100, the image reconstructing function 15a generates a diffusion weighted image 21z (step S203). In this manner, the image reconstructing function 15a generates the diffusion weighted image 21z corresponding to the b-factor of which the value is 100. The diffusion weighted image 21z is an example of the first MR image corresponding to the Z-axis direction.

In this situation, as explained above, at steps S201 through S203, on the basis of the MR signals obtained as a result of the controlling function 14a controlling the transmission coil 4 and the gradient coil 2, the image reconstructing function 15a generates the diffusion weighted images 21x to 21z each of which corresponds to a different one of the plurality of axial directions. Further, with respect to each of the axial directions, the image reconstructing function 15a generates a corresponding one of the diffusion weighted images 21x to 21z.

After that, by performing the same process as that at step S102 described above, the image reconstructing function 15a generates the diffusion weighted image 22 (step S204).

Similarly, by performing the same process as that at step S103 described above, the image reconstructing function 15a generates the diffusion weighted image 23 (step S205).

Similarly, by performing the same process as that at step S104 described above, the image reconstructing function 15a generates the diffusion weighted image 24 (step S206).

After that, the combining function 15b obtains a computed diffusion weighted image 29 corresponding to the b-factor of which the value is 2000 by performing a calculating process that uses the diffusion weighted image 21x and the diffusion weighted image 22 (step S207). The b-factor of which the value is 2000 is an example of the third b-factor. Further, the computed diffusion weighted image 29 is an example of a third MR image.

A specific example of the process at step S207 will be explained. For stance, the combining function 15b derives an ADC with respect to each of the pixels, by using Expression (3) presented below.

$$ADC = \log_n[S(1000) - S(100)]/(1000 - 100) \quad (3)$$

In Expression (3), S(100) denotes the signal value of each of the pixels in the diffusion weighted image 21x.

Further, the combining function 15b derives the signal value S(2000) of each of the pixels in the computed diffusion weighted image 25 by using Expression (4) presented below.

$$S(2000) = S(1000) \cdot \exp[-(2000 - 100) \cdot ADC] \quad (4)$$

After that, the combining function 15b obtains a diffusion weighted image in which the derived signal value S(2000) is arranged in each of all the pixels, as the computed diffusion weighted image 29.

Similarly, the combining function 15b obtains a computed diffusion weighted image 30 corresponding to the b-factor of which the value is 2000, by performing a calculating process that uses the diffusion weighted image 21y and the diffusion weighted image 23 (step S208).

Also, similarly, the combining function 15b obtains a computed diffusion weighted image 31 corresponding to the b-factor of which the value is 2000, by performing a calculating process that uses the diffusion weighted image 21z and the diffusion weighted image 24 (step S209).

After that, the combining function 15b calculates a combined image 32, by combining together the computed diffusion weighted image 29, the computed diffusion weighted image 30, and the computed diffusion weighted image 31 (step S210). The combined image 32 is an isotropic diffusion weighted image. After that, the combining function 15b ends the image generating process.

In the present modification example, at steps S207 through S209, the combining function 15b obtains through the calculation, with respect to each of the axial directions, the corresponding one of the computed diffusion weighted images 29 to 31, as the computed image. More specifically, with respect to each of the axial directions, the combining function 15b obtains the corresponding one of the computed diffusion weighted images as the computed image, by using the corresponding one of the diffusion weighted images 21x to 21z and the corresponding one of the diffusion weighted images 22 to 24. After that, at step S210, the combining function 15b generates the combined image 32 by combining together the plurality of computed diffusion weighted images 29 to 31 each of which was obtained with respect to a different one of the axial directions.

The MRI apparatus according to the modification example is configured to generate the computed diffusion weighted image 29, by using the diffusion weighted image 21x corresponding to the X-axis direction and the diffusion weighted image 22. Similarly, the MRI apparatus according to the modification example generates the computed diffusion weighted image 30 by using the diffusion weighted image 21y corresponding to the Y-axis and the diffusion weighted image 23 and further generates the computed diffusion weighted image 31 by using the diffusion weighted image 21z corresponding to the 2-axis direction and the diffusion weighted image 24.

In this manner, the MRI apparatus according to the modification example is configured to obtain the computed diffusion weighted image with respect to each of the axial directions, by using the two diffusion weighted images that have mutually-different b-factors and each of which was generated with respect to a different one of the axial directions. Accordingly, it is possible to calculate, with a high level of precision, the ADCs that are derived for obtaining the computed diffusion weighted images. Consequently, by using the MRI apparatus according to the modification example, it is possible to further improve the quality of the computed diffusion weighted images obtained through the calculating process.

Second Embodiment

Incidentally, it is possible incorporate the functions of the MRI apparatus 100 according to the first embodiment or the functions of the MRI apparatus according to the modification example into an image processing apparatus connected to the MRI apparatus via a network. This embodiment will be explained as a second embodiment, with reference to FIG. 7.

Figure 7:
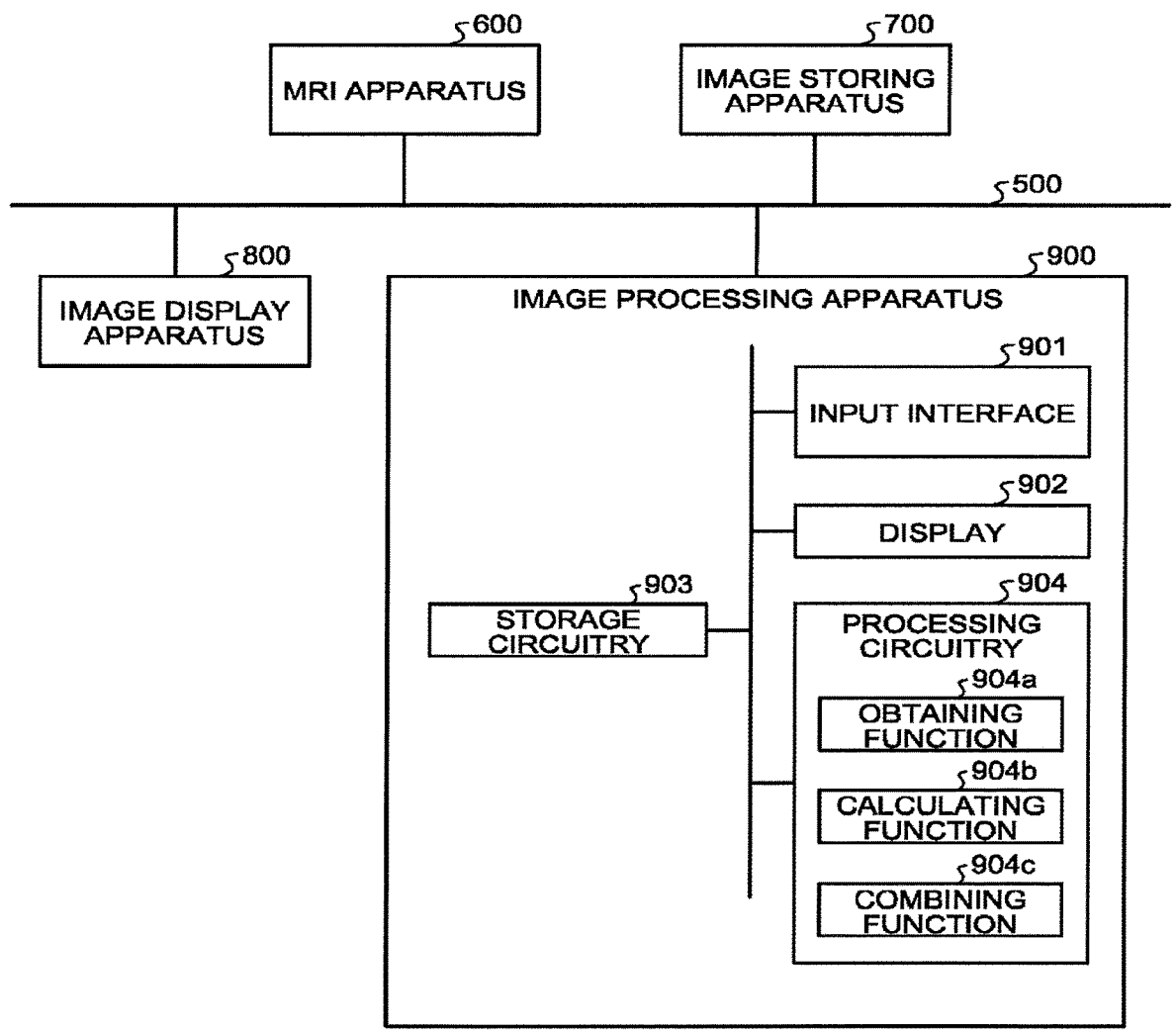
FIG. 7 is a diagram illustrating an exemplary configuration of a system including an image processing apparatus according to a second embodiment.

FIG. 7 is a diagram illustrating an exemplary configuration of a system including an image processing apparatus 900 according to the second embodiment. The system illustrated in FIG. 7 includes an MRI apparatus 600, an image storing apparatus 700, an image display apparatus 800, and an image processing apparatus 900. The MRI apparatus 600, the image storing apparatus 700, the image display apparatus 800, and the image processing apparatus 900 are able to communicate with one another either directly or indirectly, via an intra-hospital Local Area Network (LAN) 500 installed in a hospital, for example. For example, when a Picture Archiving and Communication System (PACS) has been introduced, the apparatuses 600, 700, 800, and 900 transmit and receive image and the like to and from one another according to a Digital Imaging and Communications in Medicine (DICOM) specification.

The MRI apparatus 600 is either the MRI apparatus 100 according to the first embodiment or the MRI apparatus according to the modification example. When being the MRI apparatus 100, the MRI apparatus 600 is configured, for example, to transmit the diffusion weighted images 21 to 24 to the image processing apparatus 900. Alternatively, when being the MRI apparatus according to the modification example, the MRI apparatus 600 is configured, for example, to transmit the diffusion weighted images 21x to 21z and 22 to 24 to the image processing apparatus 900.

The image storing apparatus 700 is a database configured to store therein MR images generated by the MRI apparatus 600 and the image processing apparatus 900.

The image processing apparatus 900 is a workstation and has functions equivalent to either the functions of the MRI apparatus 100 according to the first embodiment or the functions of the MRI apparatus according to the modification example. By using the diffusion weighted images transmitted thereto from the MRI apparatus 600, the image processing apparatus 900 performs the same processes as either those performed by the MRI apparatus 100 according to the first embodiment or those performed by the MRI apparatus according to the modification example.

The image processing apparatus 900 includes an input interface 901, a display 902, storage circuitry 905, and processing circuitry 904.

The input interface 901 is configured to receive operations to input various types of instructions and various types of information from the operator. More specifically, the input interface 901 is connected to the processing circuitry 904 and is configured to convert the input operations received from the operator into electrical signals and to output the electrical signals to the processing circuitry 904. For example, the input interface 901 is realized by using a trackball, a switch button, a mouse, a keyboard, a touchpad on which an input operation can be performed by touching the operation screen thereof, a touch screen in which a display screen and a touchpad are integrally formed, a contactless input interface using an optical sensor, an audio input interface, and/or the like. In the present disclosure, possible embodiments of the input interface 901 are not limited to those including physical operation component parts such as a mouse and/or a keyboard. Possible examples of the input interface 901 include electrical signal processing circuitry configured to receive an electrical signal corresponding to an input operation from an external input device provided separately from the apparatus and to output the received electrical signal to the processing circuitry 904.

The display 902 is configured to display various types of information and various types of images. More specifically, the display 902 is connected to the processing circuitry 904 and is configured to convert the various types of information and data of the various types of images sent thereto from the processing circuitry 904, into display-purpose electrical signals and to output the display-purpose electrical signals. For example, the display 902 is realized by using a liquid crystal monitor, a Cathode Ray Tube (CRT) monitor, a touch panel, or the like.

The storage circuitry 903 is configured store various types of data therein. More specifically, the storage circuitry 903 is configured to store therein various types of images. For example, the storage circuitry 903 is realized by using a semiconductor memory element such as a Random Access Memory (RAM), a flash memory, or the like, or a hard disk, an optical disk, or the like.

The processing circuitry 904 is configured to exercise overall control of the image processing apparatus 900. For example, when having received a diffusion weighted image transmitted from the MRI apparatus 600, the processing circuitry 904 stores the received diffusion weighted image into the storage circuitry 903. The processing circuitry 904 is realized by using a processor. The processing circuitry 904 includes an obtaining function 904a, a calculating function 904b, and a combining function 904c.

In this situation, for example, functions of the obtaining function 904a, the calculating function 904b, and the combining function 904c, which are constituent elements of the processing circuitry 904, are stored in the storage circuitry 903 in the form of computer-executable programs. The processing circuitry 904 is configured to realize the functions, by reading the programs from the storage circuitry 903 and executing the read programs. In other words, the processing circuitry 904 that has read the programs has the functions illustrated within the processing circuitry 904 in FIG. 7.

The obtaining function 904a is configured to obtain any of the diffusion weighted images stored in the storage circuitry 903. For example, the obtaining function 904a obtains the diffusion weighted images 21 to 24 stored in the storage circuitry 903. As another example, the obtaining function 904a obtains the diffusion weighted images 21x to 21z and 22 to 24 stored in the storage circuitry 903.

The calculating function 904b is configured to perform the same processes as those at steps S105 through S107 explained above. In other words, the calculating function 904b obtains through the calculating process, with respect to each of the axial directions, the corresponding one of the computed diffusion weighted images 25 to 27 as the computed image, by using the corresponding one of the diffusion weighted images 22 to 24 and the diffusion weighted image 21. Further, the combining function 904c performs the same process as the process at step S108 explained above. In other words, the combining function 904c generates the combined image 28 by combining together the plurality of computed diffusion weighted images 25 to 27 each of which was obtained with respect to a different one of the axial directions.

As another example, the calculating function 904b performs the same processes as those at steps S207 through S209 explained above. In other words, the calculating function 904b obtains through the calculating process, with respect to each of the axial directions, the corresponding one of the computed diffusion weighted images 29 to 31 as the computed image, by using the corresponding one of the diffusion weighted images 21x to 21z and the corresponding one of the diffusion weighted images 22 to 24. After that, the combining function 904c performs the same process as that at step S210. In other words, the combining function 904c generates the combined image 32 by combining together the plurality of computed diffusion weighted images 29 to 31 each of which was obtained with respect to a different one of the axial directions.

The image processing apparatus 900 according to the second embodiment has thus been explained. By using the image processing apparatus 900, in the same manner as in the first embodiment or the modification example, it is possible to improve the quality of the computed diffusion weighted images obtained through the calculating process.

In the first embodiment, the modification example, and the second embodiment, the examples are explained in which the computed diffusion weighted images are obtained by using the diffusion weighted images corresponding to the three axial directions, namely, the X-axis direction, the Y-axis direction, and the Z-axis direction; however, it is also acceptable to obtain the computed diffusion weighted images by performing the same process while using diffusion weighted images corresponding to at least two axial directions. For example, it is also acceptable to obtain computed diffusion weighted images by using diffusion weighted images corresponding to six axial directions.

According to at least one aspect of the embodiments and the modification examples explained above, it is possible to improve the quality of the computed diffusion weighted images obtained through the calculating process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image processing apparatus comprising processing circuitry configured:
   to obtain a first Magnetic Resonance (MR) image corresponding to a first b-factor and corresponding to each of a plurality of axial directions and to obtain a second MR image corresponding to a second b-factor different from the first b-factor and corresponding to each of the plurality of axial directions;
   to obtain through a calculation, with respect to each of the axial directions, a third MR image as a computed image corresponding to a third b-factor different from the first b-factor and the second b-factor by using the first MR image and the second MR image; and
   to generate a combined image by combining together the plurality of computed images each of which was obtained with respect to a different one of the axial directions.

2. The image processing apparatus according to claim 1, wherein the first MR image is an MR image obtained under a condition where the first b-factor is zero and obtained without applying any Motion Probing Gradient (MPG) pulse.

3. The image processing apparatus according to claim 1, wherein the first MR image is an MR image obtained with respect to each of the axial directions under a condition where the first b-factor is larger than zero.

4. A magnetic resonance imaging apparatus comprising:
   a static magnetic field magnet configured to form a static magnetic field;
   a gradient coil configured to superimpose, in an arbitrary axial direction, a gradient magnetic field onto the static magnetic field;
   a radio frequency coil configured to generate an MR signal by applying a radio frequency magnetic field onto a subject placed in the static magnetic field; and processing circuitry configured to control the radio frequency coil so as to apply the radio frequency magnetic field, to control the gradient coil so as to apply a Motion Probing Gradient (MPG) pulse having a designated b-factor to each of a plurality of axial directions, to generate a first MR image corresponding to a first b-factor and corresponding to each of the plurality of axial directions and to generate a second MR image corresponding to a second b-factor different from the first b-factor and corresponding to each of the plurality of axial directions on a basis of an MR signal obtained as a result of controlling the radio frequency coil and the gradient coil, to further obtain through a calculation, with respect to each of the axial directions, a third MR image as a computed image corresponding to a third b-factor different from the first b-factor and the second b-factor by using the first MR image and the second MR image, and to generate a combined image by combining together the plurality of computed images each of which was obtained with respect to a different one of the axial directions.

5. The magnetic resonance imaging apparatus according to claim 4, wherein the first MR image is an MR image obtained under a condition where the first b-factor is zero and obtained without applying any Motion Probing Gradient (MPG) pulse.

6. The magnetic resonance imaging apparatus according to claim 4, wherein the first MR image is an MR image obtained with respect to each of the axial directions under a condition where the first b-factor is larger than zero.

7. An image generating method comprising:
obtaining a first Magnetic Resonance (MR) image corresponding to a first b-factor and corresponding to each of a plurality of axial directions and obtaining a second MR image corresponding to a second b-factor different from the first b-factor and corresponding to each of the plurality of axial directions;
obtaining through a calculation, with respect to each of the axial directions, a third MR image as a computed image corresponding to a third b-factor different from the first b-factor and the second b-factor by using the first MR image and the second MR image; and
generating a combined image by combining together the plurality of computed images each of which was obtained with respect to a different one of the axial directions.

8. The image generating method according to claim 7, wherein the first MR image is an MR image obtained under a condition where the first b-factor is zero and obtained without applying any Motion Probing Gradient (MPG) pulse.

9. The image generating method according to claim 7, wherein the first MR image is an MR image obtained with respect to each of the axial directions under a condition where the first b-factor is larger than zero.

* * * * *